(12) United States Patent
Goo et al.

(10) Patent No.: US 6,936,516 B1
(45) Date of Patent: Aug. 30, 2005

(54) REPLACEMENT GATE STRAINED SILICON FINFET PROCESS

(75) Inventors: Jung-Suk Goo, Stanford, CA (US); Qi Xiang, San Jose, CA (US); James N. Pan, Fishkill, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 68 days.

(21) Appl. No.: 10/755,811

(22) Filed: Jan. 12, 2004

(51) Int. Cl.[7] .................. H01L 21/336; H01L 21/00
(52) U.S. Cl. ................................. 438/283; 438/157
(58) Field of Search ................. 438/585, 590, 438/183, 157, 283

(56) References Cited

U.S. PATENT DOCUMENTS

| | | | | |
|---|---|---|---|---|
| 6,365,465 B1 * | 4/2002 | Chan et al. | ............... | 438/283 |
| 6,475,869 B1 * | 11/2002 | Yu | ............... | 438/197 |
| 6,605,498 B1 * | 8/2003 | Murthy et al. | ............... | 438/197 |
| 6,764,884 B1 * | 7/2004 | Yu et al. | ............... | 438/157 |
| 6,800,910 B2 * | 10/2004 | Lin et al. | ............... | 257/410 |
| 6,803,631 B2 * | 10/2004 | Dakshina-Murthy et al. | .... | 257/349 |
| 6,815,738 B2 * | 11/2004 | Rim | ............... | 257/256 |
| 6,852,559 B2 * | 2/2005 | Kwak et al. | ............... | 438/44 |
| 6,855,582 B1 * | 2/2005 | Dakshina-Murthy et al. | .... | 438/157 |
| 6,855,583 B1 * | 2/2005 | Krivokapic et al. | ........ | 438/157 |
| 6,855,989 B1 * | 2/2005 | Wang et al. | ............... | 257/347 |
| 6,885,055 B2 * | 4/2005 | Lee | ............... | 257/308 |
| 2002/0037619 A1 * | 3/2002 | Sugihara et al. | ............ | 438/289 |
| 2003/0178677 A1 * | 9/2003 | Clark et al. | ............... | 257/347 |
| 2003/0215184 A1 * | 11/2003 | Salib | ............... | 385/37 |
| 2004/0169239 A1 * | 9/2004 | Rim | ............... | 257/411 |
| 2005/0040444 A1 * | 2/2005 | Cohen | ............... | 257/288 |
| 2005/0048727 A1 * | 3/2005 | Maszara et al. | ............ | 438/285 |

OTHER PUBLICATIONS

Huang et al., "Sub 50-nm FinFET: PMOS", 1999, IEDM Techincal Digest, pp. 67-70.*
Huang et al., "Sub-50 nm P-Channel FinFET", May 2001, IEEE Trans. on Electron Devices, pp. 880-886.*

* cited by examiner

Primary Examiner—Olik Chaudhuri
Assistant Examiner—Lex H. Malsawma
(74) Attorney, Agent, or Firm—Foley & Lardner LLP

(57) ABSTRACT

An exemplary embodiment relates to a method of FinFET formation. The method can include providing a sacrificial fin structure, removing the sacrificial fin structure, and providing a strained silicon layer at the location of the removed sacrificial gate structure. The FinFET can include a strained-Si MOSFET channel region.

20 Claims, 7 Drawing Sheets

REPLACEMENT GATE STRAINED SILICON FINFET PROCESS

FIELD OF THE INVENTION

The present invention relates generally to integrated circuits (ICs) and methods of manufacturing integrated circuits. More particularly, the present invention relates to a method of fabricating integrated circuits having transistors with a fin-shaped channel region or finFETS.

BACKGROUND OF THE INVENTION

Integrated circuits (ICs), such as ultra-large-scale integrated (ULSI) circuits, can include as many as one million transistors or more. The ULSI circuit can include complementary metal oxide semiconductor (CMOS) field effect transistors (FETS). Such transistors can include semiconductor gates disposed above a channel region and between source and drain regions. The source and drain regions are typically heavily doped with a P-type dopant (e.g., boron) or an N-type dopant (e.g., phosphorous).

Double gate transistors, such as vertical double gate silicon-on-insulator (SOI) transistors or finFETS, have significant advantages related to high drive current and high immunity to short channel effects. An article by Huang, et al. entitled "Sub-50 nm FinFET: PMOS" (1999 IEDM) discusses a silicon transistor in which the active layer is surrounded by a gate on two sides. However, double gate structures can be difficult to manufacture using conventional IC fabrication tools and techniques. Further, patterning can be difficult because of the topography associated with a silicon fin. At small critical dimensions, patterning may be impossible.

By way of example, a fin structure can be located over a layer of silicon dioxide, thereby achieving an SOI structure. Conventional finFET SOI devices have been found to have a number of advantages over devices formed using semiconductor substrate construction, including better isolation between devices, reduced leakage current, reduced latch-up between CMOS elements, reduced chip capacitance, and reduction or elimination of short channel coupling between source and drain regions. While the conventional finFET SOI devices provide advantages over MOSFETs formed on bulk semiconductor substrates due to its SOI construction, some fundamental characteristics of the finFET, such as carrier mobility, are the same as those of other MOSFETs because the finFET source, drain and channel regions are typically made from conventional bulk MOSFET semiconductor materials (e.g., silicon).

The fin structure of finFET SOI devices can be located below several different layers, including a photoresist layer, a bottom anti-reflective coating (BARC) layer, and a polysilicon layer. Various problems can exist with such a configuration. The photoresist layer may be thinner over the fin structure. In contrast, the polysilicon layer and BARC layer may be very thick at the edge of the fin structure. Such a configuration leads to large over-etch requirements for the BARC layer and the polysilicon layer. Such requirements increase the size of the transistor.

There is a need for an integrated circuit or electronic device that includes channel regions with higher channel mobility, higher immunity to short channel effects, and higher drive current. Further, there is a need for a method of patterning finFET devices having small critical dimensions. Even further, there is a need for a method of fabricating strained silicon fin-shaped channels for finFET devices. Further still, there is a need for a finFET device with a strained semiconductor fin-shaped channel region. Yet even further, there is a need for a process of fabricating a finFET device with a strained semiconductor fin-shaped channel.

SUMMARY OF THE INVENTION

An exemplary embodiment relates to a method of forming a fin-shaped transistor. The method includes providing a sacrificial fin structure in a compound semiconductor layer, removing the sacrificial fin structure to form a trench in the compound semiconductor layer, and providing a fin-shaped strained silicon structure within the trench. The trench is associated with the fin-shaped transistor. The method also includes forming a gate structure for the fin-shaped strained silicon structure.

Another exemplary embodiment relates to a method of forming a finFET. The method includes providing a first layer above an insulating layer above a substrate. The first layer includes silicon germanium and a fin structure. The method also includes removing the fin structure to form an aperture in the first layer, providing a strained material within the aperture, and providing a gate structure for the strained material. The gate structure is used to form the finFET.

Yet another exemplary embodiment relates to a method of fabricating an integrated circuit including a fin-based transistor. The method includes steps of providing an insulative material, providing a strain-inducing layer above the insulative material. The strain-inducing layer includes a narrow trench. The narrow trench includes the sacrificial fin structure. The method also includes removing the sacrificial fin structure and forming a strained material in the trench.

BRIEF DESCRIPTION OF THE DRAWINGS

Exemplary embodiments will hereafter be described with reference to the accompanying drawings, wherein like numerals denote like elements, and.

DETAILED DESCRIPTION OF EXEMPLARY EMBODIMENTS

Figure 1:
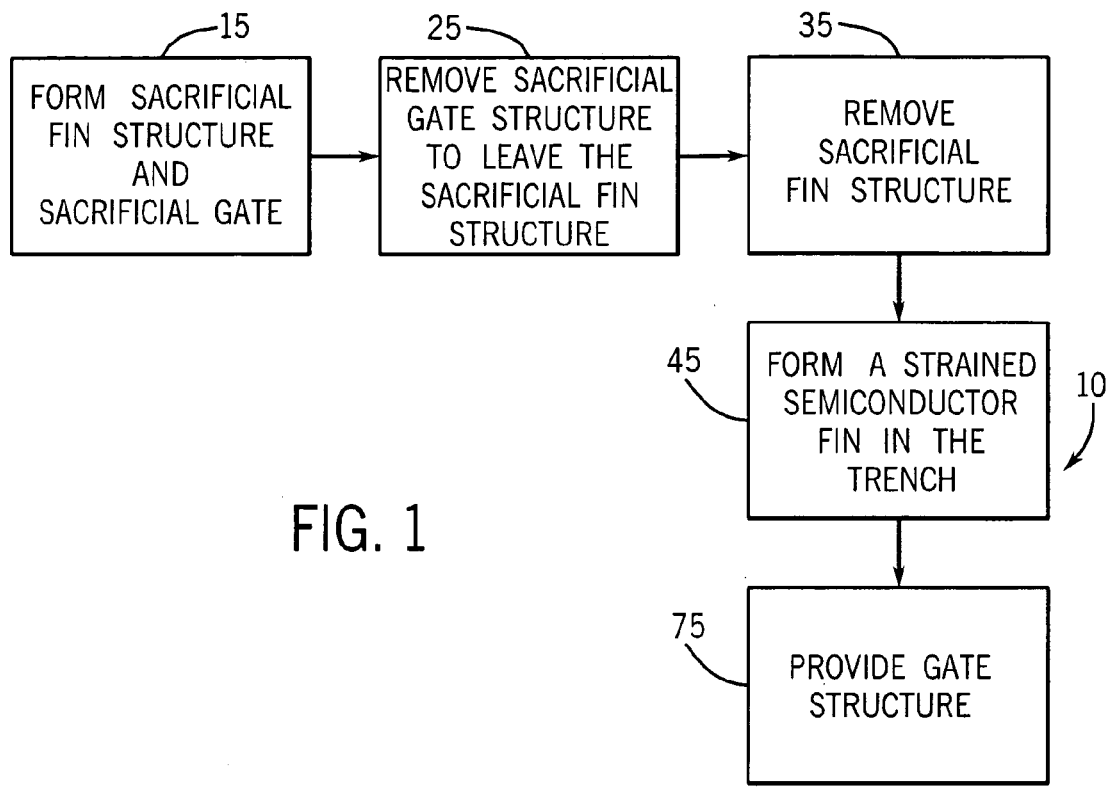
FIG. 1 is a flow diagram depicting exemplary operations in a process for forming a fin-based transistor for an integrated circuit in accordance with an exemplary embodiment.

FIG. 1 is a flow diagram depicting exemplary operations in a method or process 10 of fabricating a fin-based transistor or fin field effect transistor (finFET). In particular, process 10 advantageously utilizes a sacrificial structure to form a recess and forms a strained fin-based channel region in the recess. The flow diagram of FIG. 1 illustrates by way of example some operations that may be performed. Additional operations, fewer operations, or combinations of operations may be utilized in various different embodiments of process 10.

Process 10 begins with a conventional finFET structure disposed in an aperture in a compound semiconductor layer. The conventional finFET structure includes a sacrificial gate and a sacrificial fin structure.

In FIG. 1, process 10 utilizes a substrate including a sacrificial gate structure and a compound semiconductor layer formed in a step 15. In one embodiment, the compound semiconductor layer can be deposited over an insulative layer including a sacrificial fin structure and a sacrificial gate structure over the sacrificial fin structure. The compound semiconductor layer is planarized to have a height that is co-planar with the height of the sacrificial gate structure.

In one embodiment, the sacrificial gate structure is a different material than the compound semiconductor material and is patterned above the insulating layer before the compound semiconductor layer is deposited. After the sacrificial fin structure is patterned, it is coated with a dielectric material and a gate conductor to complete the sacrificial gate structure.

In another embodiment, the sacrificial gate structure is formed from the compound layer. In this embodiment, the compound semiconductor layer is deposited above a insulating layer above the substrate and patterned to form sacrificial fin structures for step 15. The sacrificial fin structure can be patterned in the compound and semiconductor layer according to a conventional photolithographic process. A sacrificial gate structure is formed over the sacrificial fin structure.

The sacrificial fin structure and sacrificial gate structure can be manufactured from a variety of materials. Preferably, the materials of the gate structure are different than those used to form the compound semiconductor layer. The structures can be formed in accordance with conventional processes. Preferably, the sacrificial fin structure is relatively narrow from left to right and has a high aspect ratio (e.g., dimensions of approximately 20 nanometers by 50 nanometers).

In a step 25 of process 10, the sacrificial gate structure is removed to leave the sacrificial fin structure within an aperture or trench provided in the compound semiconductor layer. In a step 35, the sacrificial fin structure is removed from within the trench. Various etching processes can be utilized to remove the sacrificial gate and fin structures. Preferably, separate dry etching operations selective to the materials in the sacrificial structures are utilized to excavate the trench.

In a step 45 of process 10, a strained silicon fin structure is formed in the trench. Preferably, the sidewalls associated with the trench in the compound semiconductor layer are utilized to form the strained silicon fin. The strained silicon fin can be laterally grown using the side wall of the trench in the compound semiconductor layer as a seed surface. The trench preferably includes a bottom which is used as a top surface of the insulative layer upon which the compound semiconductor layer is deposited. The strained channel may be formed using a selective epitaxy process.

In a step 75 of process 10, a gate structure is provided to complete a fin-based transistor. The gate structure can include a metal or polysilicon gate conductor disposed over a dielectric film. In one embodiment, the gate structure surrounds the fin-based channel region on at least three sides and has a U-shaped cross-sectional shape.

With reference to FIGS. 1–12, process 10 is utilized to form a portion of an integrated circuit 100 that includes a fin-based transistor or finFET. FIGS. 3, 5, 7, 9, 11, and 13 reflect cross-sectional views about line 3—3 in FIG. 2. FIGS. 4, 6, 8, 10, 12, and 14 reflect cross-sectional views about line 4—4 in FIG. 2. FIGS. 2–14 are approximate, are not drawn to scale, and provide a conceptual interpretation of process 10 and its structures.

Figure 2:
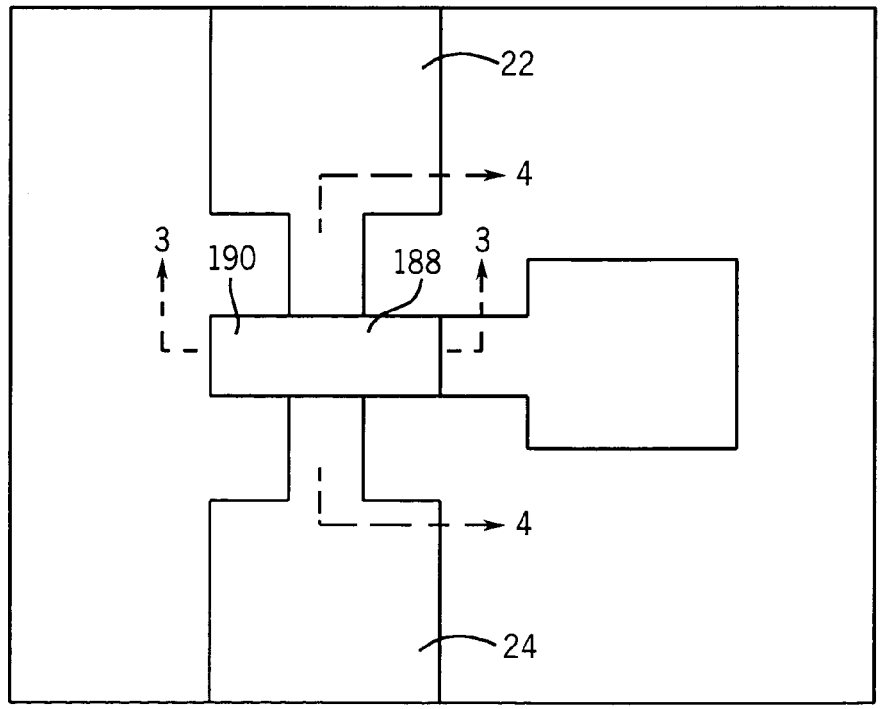
FIG. 2 is a general schematic planar top view of a portion of an integrated circuit including a sacrificial fin structure for the process shown in FIG. 1 in accordance with an exemplary embodiment.
Figure 11:
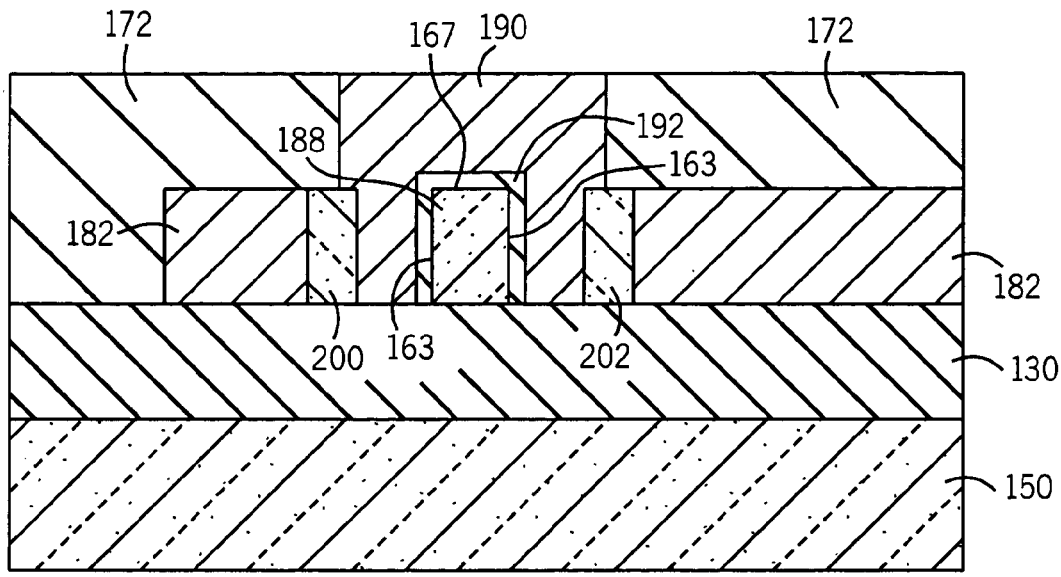
FIG. 11 is a schematic cross-sectional view of the portion of the integrated circuit illustrated in FIG. 9 showing a gate formation operation in accordance with the process illustrated in FIG. 1.
Figure 12:
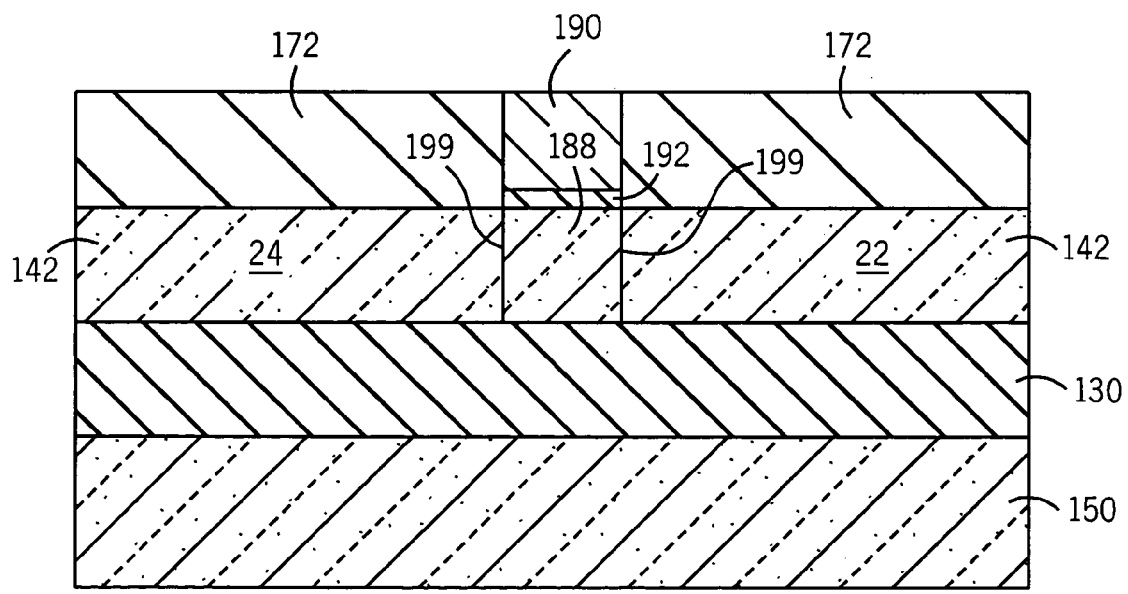
FIG. 12 is a schematic cross-sectional view of the portion of the integrated circuit illustrated in FIG. 10 showing the gate formation operation.

In FIG. 2, the fin-based transistor includes a source region 22 and a drain region 24 disposed on opposite sides of a fin-shaped strained silicon channel region 188. A gate conductor 190 is disposed over channel region 188 and a gate dielectric layer 192 (FIGS. 11 and 12). Gate conductor 190 and layer 192 are provided on three sides of channel region 188 and have a U-shaped cross-sectional shape (FIG. 11). Channel region 188 is disposed in a trench 180.

In FIG. 12, gate conductor 190 has a rectangular cross-sectional shape and is disposed above dielectric layer 192 above a top surface of fin-shaped channel region 188. Gate conductor 190 can be a metal layer or can be a polysilicon layer (e.g., a doped polysilicon layer). Gate conductor 190 is preferably a layer of polysilicon having a thickness between approximately 50 nanometers and 150 nanometers and is heavily doped with dopants.

Dielectric layer 192 can be made of any suitable material for use in gate structures. In one embodiment, dielectric layer 190 is thermally grown silicon dioxide having a thickness of between approximately 3 and 20 Å. In another embodiment, dielectric layer 192 is a high-K gate dielectric layer, a silicon nitride layer, or another insulator.

Dielectric layer 192 and gate conductor 190 form a gate structure on lateral sides 163 and above a top surface 167 of fin-shaped channel region 188 (see FIG. 11). Alternatively, gate conductor 190 can be provided only adjacent lateral sides 163 of channel region 188. Tensile strain of channel region 188 is preferably obtained through epitaxial growth seeded from a compound semiconductor layer 142, such as a silicon germanium layer. Preferably, the seeding occurs at least one of surfaces 199 associated with layer 142.

In FIG. 12, dielectric layer 192 covers only channel region 188 and is provided only under gate conductor 190. In another embodiment, source region 22 and drain region 24 are covered by dielectric layer 192 on all sides. Regions 22 and 24 can include extensions to reduce short channel effects.

Preferably, fin-shaped channel region 188 is a tensile-strained silicon material manufactured in accordance with process 10. Although shown in FIGS. 2, 11 and 12 with a U-shaped gate structure, channel region 188 can be utilized with a variety of different types and shapes of gate structures. Gate conductor 190 and dielectric layer 192 are not shown in a limiting fashion. Conductor 190 can have a thickness of between approximately 50 nanometers and 150 nanometers and dielectric layer 192 can have a thickness of between approximately 0.5 nanometers and 1.5 nanometers.

Preferably, the length (from top to bottom in FIG. 2) from an end of source region 22 to an end of drain region 24 is between approximately 30 nanometers and 100 nanometers and a width (from left to right of channel region 188 in FIG. 2) of source and drain regions 24 is between approximately 20 nanometers and 100 nanometers. Source region 22 and drain region 24 include a strained silicon material, a single crystalline material, or a compound semiconductor material. In one embodiment, regions 22 and 24 are made of a doped version the same material as layer 142 (FIG. 12). Regions 22 and 24 are preferably doped with N-type or P-type dopants to a concentration of $10^{14}$ to $10^{20}$ dopants per cubic centimeter. Regions 22 and 24 can be doped at any point in process 10 (although shown herein as being doped in FIGS. 13 and 14).

Figure 3:
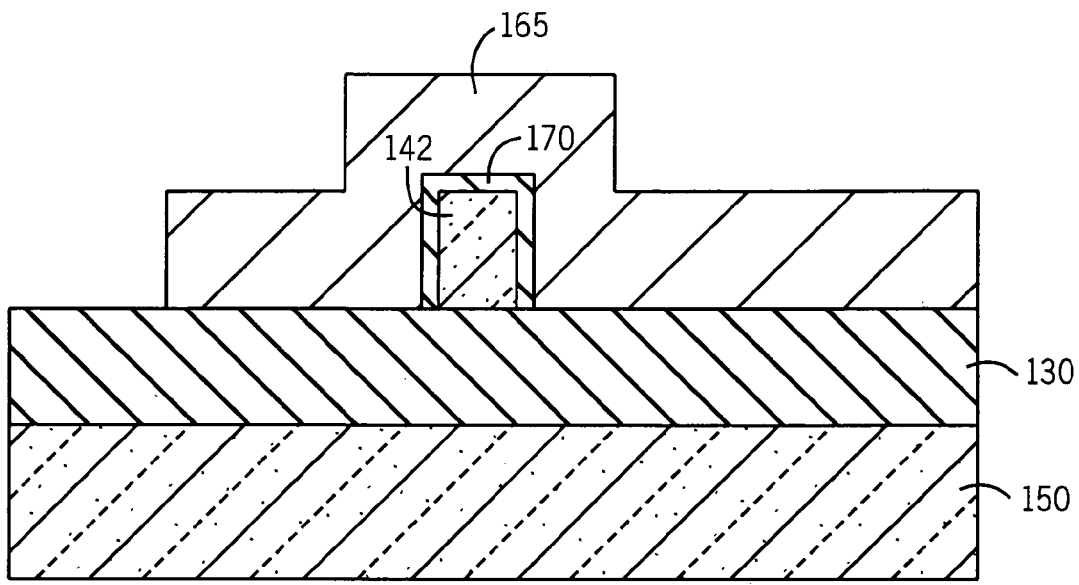
FIG. 3 is a schematic cross-sectional view of the portion of the integrated circuit illustrated in FIG. 2 taken across line 3—3 in accordance with an exemplary embodiment.
Figure 4:
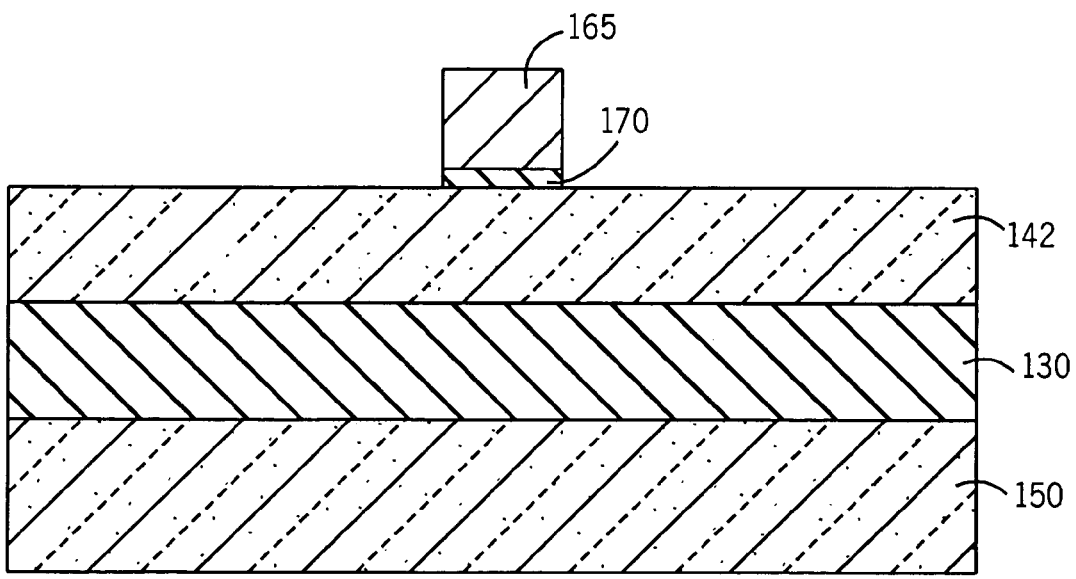
FIG. 4 is a schematic cross-sectional view of the portion of the integrated circuit illustrated in FIG. 2 taken across line 4—4 in accordance with an exemplary embodiment.
Figure 5:
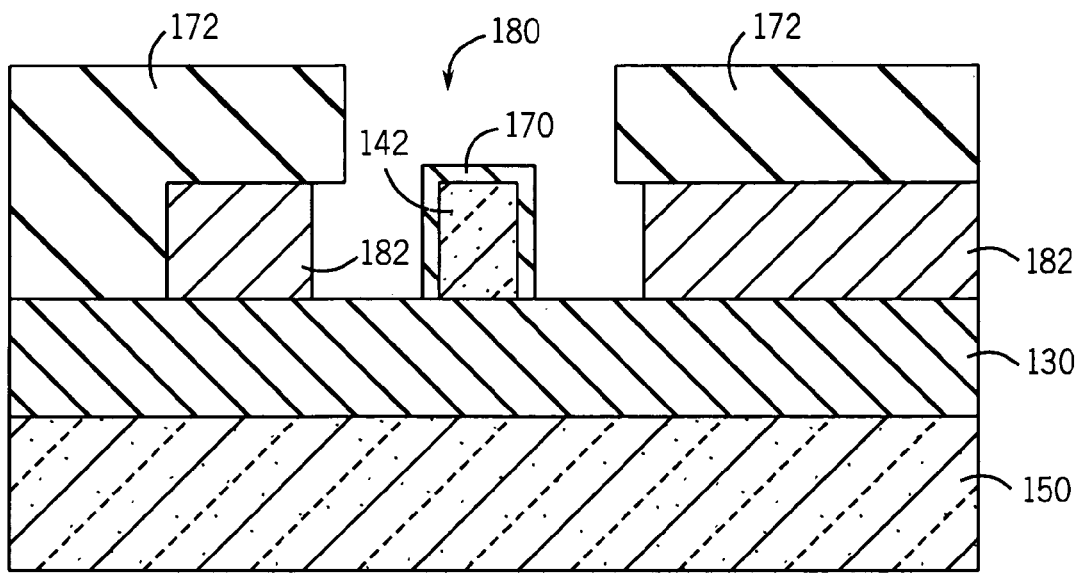
FIG. 5 is a schematic cross-sectional view of a portion of the integrated circuit illustrated in FIG. 3 showing a gate conductor removal operation in accordance with the process illustrated in FIG. 1.
Figure 6:
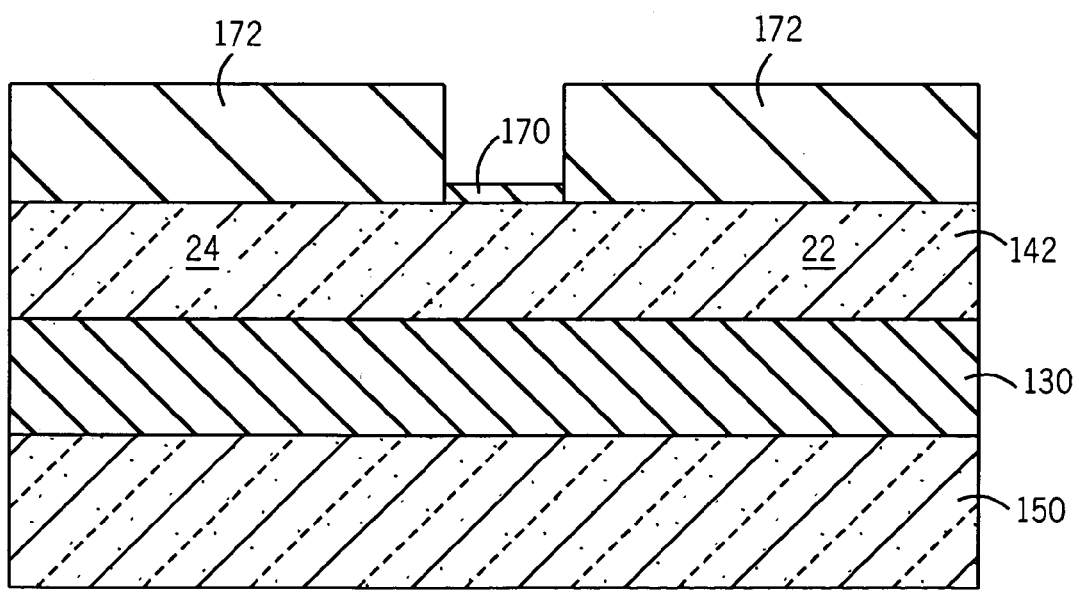
FIG. 6 is a schematic cross-sectional view of the portion of the integrated circuit illustrated in FIG. 4 showing the gate conductor removal operation.

With reference to FIGS. 3 and 4, a portion of layer 142 acts as a sacrificial fin-shaped channel region or structure. Insulative layer 130 is preferably a buried oxide (BOX) structure, such as a silicon dioxide layer. In one embodiment, layer 130 has a thickness of between approximately 30 nanometers and 200 nanometers. Layer 130 can be provided above any type of substrate or may be a substrate itself.

In one embodiment, insulative layer 130 is provided above a semiconductor base layer 150 such as a silicon base layer. Layers 130 and 150 can comprise a silicon or semiconductor-on-insulator (SOI) substrate. Alternatively, layer 142 can be provided above other types of substrates and layers. However, the preferred embodiment provides layer 142 above an insulating layer such as a buried oxide layer (BOX) above a silicon substrate. Alternatively, layers 130 and 150 including sacrificial fin-shaped portion of layer 142 can be purchased from a wafer manufacturer.

Layer 142 (FIG. 4) is preferably a compound semiconductor layer or a strain-inducing semiconductor layer, such as a silicon germanium layer. Layer 142 is disposed above layer 130 and preferably a composition of $Si_{1-X}Ge_X$, where X is approximately 0.2, and is more generally in the range of 0.1 to 0.3. Various methods can be utilized to produce layers 130, 140, and 150, including chemical vapor deposition (CVD). Layer 142 is preferably provided as a 50 nanometer thick layer and induces strain in subsequently formed region 188.

A sacrificial gate dielectric layer 170 and a sacrificial gate conductor or structure 165 can be provided above layer 142 in accordance with step 15 of process 10. Gate conductor 165 is preferably a polysilicon material and gate dielectric 170 is preferably a dielectric material. Gate dielectric 170 can be silicon nitride ($Si_3N_4$).

With reference to FIGS. 5–8, after gate conductor 165 is provided, a TEOS-deposited dielectric layer 172 is provided over sacrificial gate conductor 165 and layer 130. An aperture or trench 180 is provided in layer 142 in accordance with step 25 of process 10 (FIG. 1). Preferably, trench 180 has a bottom that is coplanar with a top surface of layer 130. Alternatively, the bottom of trench 180 can terminate before layer 130. Various dimensions can be utilized for trench 180 depending upon design criteria and system parameters for the fin-based transistor.

Preferably, the first portion of trench 180 is formed by polishing dielectric layer 172 to expose gate conductor 165. Thereafter, a portion of gate conductor 165 is removed in an anisotropic etching step selective to the material of gate conductor 165. A dry etching process selective to polysilicon can remove the portion of gate conductor 165. Portions 182 of gate conductor 165 protected by layer 172 remain within aperture 180. Sacrificial gate dielectric 170 serves as an etch stop for the removal of sacrificial gate conductor 165.

Figure 7:
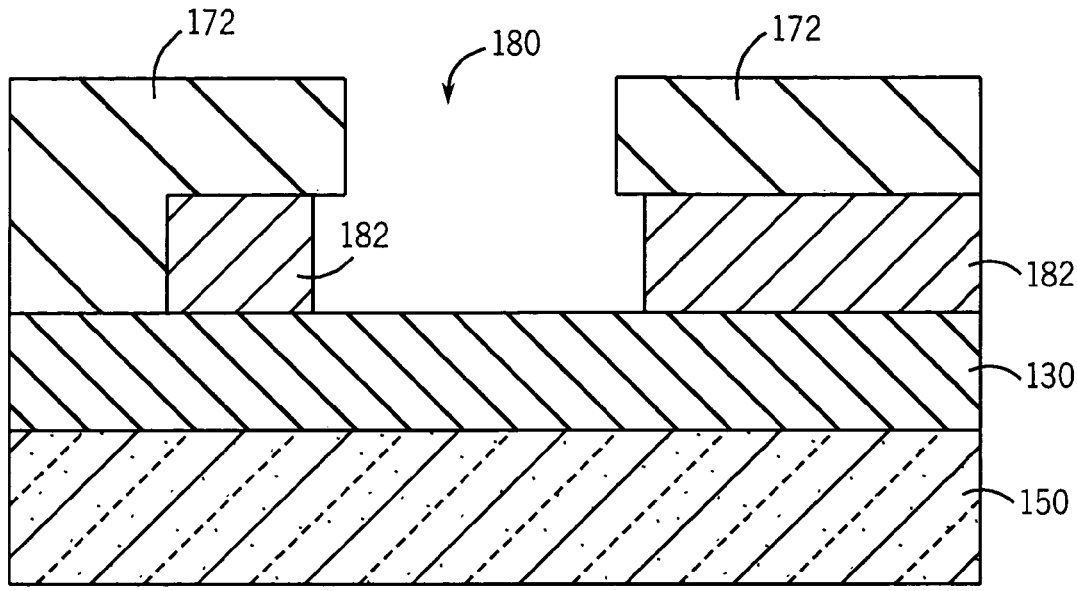
FIG. 7 is a schematic cross-sectional view of the portion of the integrated circuit illustrated in FIG. 5 showing a gate oxide and fin structure removal in accordance with the process illustrated in FIG. 1.
Figure 8:
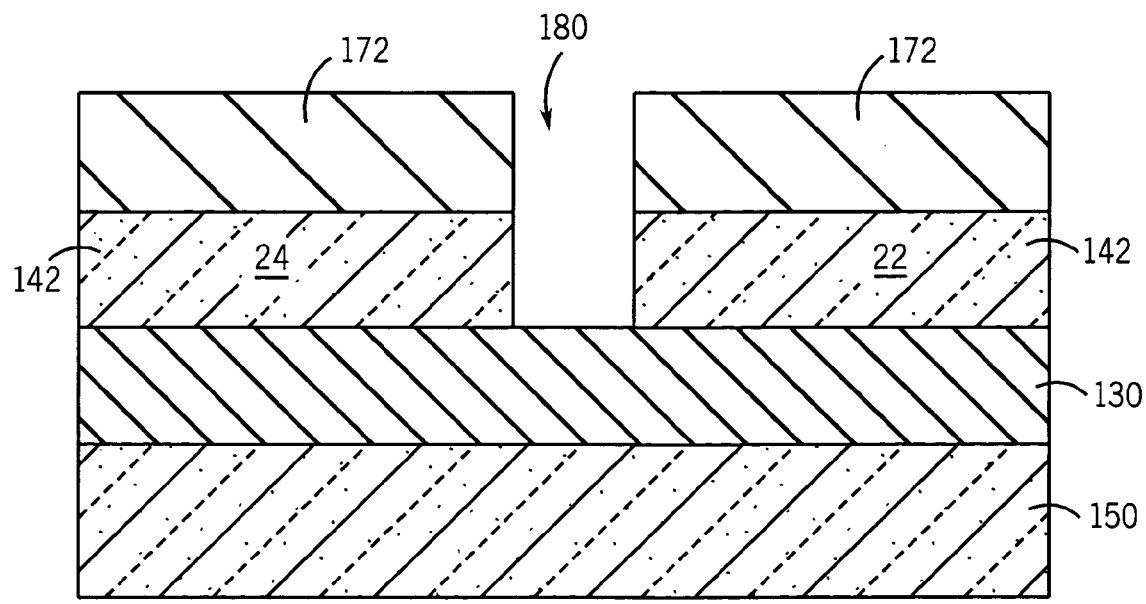
FIG. 8 is a schematic cross-sectional view of the portion of the integrated circuit illustrated in FIG. 6 showing the gate oxide and fin structure removal operation.

With reference to FIGS. 7 and 8, trench 180 is completed in accordance with step 35 of process 10. Sacrificial gate dielectric 170 can be removed in an anisotropic dry etching step selective to 170 (e.g., silicon nitride). If the material associated with gate dielectric 170 and layer 172 are the same, a mask can be provided over layer 172 to protect it. Preferably, layer 170 is removed in a dry etching step.

The portion of layer 142 acting as a sacrificial fin region is also removed in a dry etching step in accordance with step 35 of process 10 to complete trench 180. Such region is preferably removed in an anisotropic dry etching technique selective to layer 142. Advantageously, regions 22 and 24 are protected by layer 172 during this etching step. Alternatively, masks can be utilized to protect regions 22 and 24.

In one embodiment, the trench depth is approximately equal to the sum of the fin height and the gate conductor thickness. In this embodiment, the trench width is approximately the sum of the fin width and twice the gate conductor thickness.

In one embodiment, trench 180 can be formed in a photolithographic process to protect the portion of the IC that should not be removed. In one such process, antireflective coatings, hard masks, and photoresist materials are utilized to pattern a layer or layers above layer 142. The patterned layer or layers are used to create trench 180.

Figure 9:
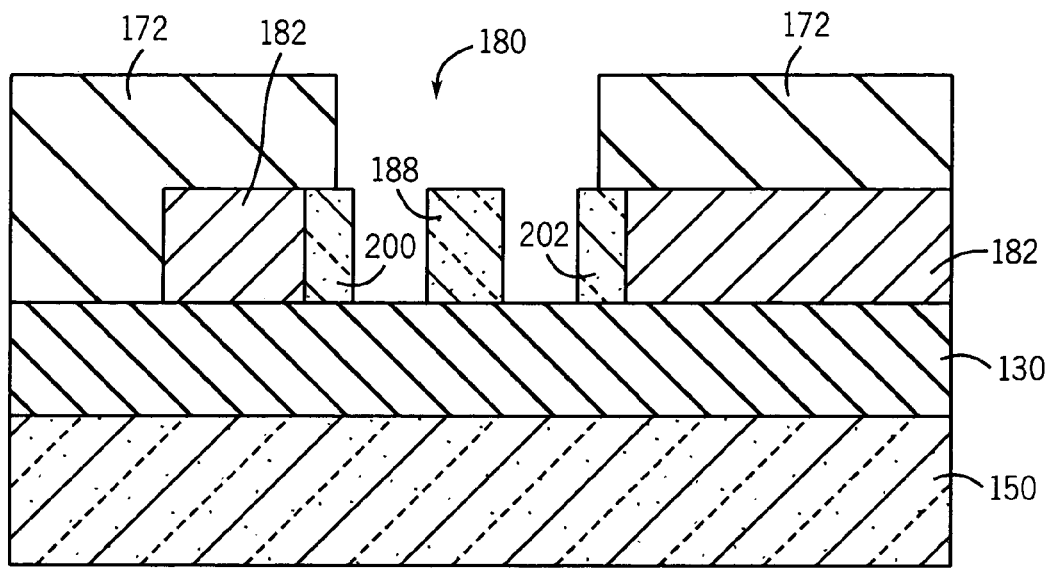
FIG. 9 is a schematic cross-sectional view of the portion of the integrated circuit illustrated in FIG. 7 showing a strained silicon formation operation in accordance with the processes illustrated in FIG. 1.
Figure 10:
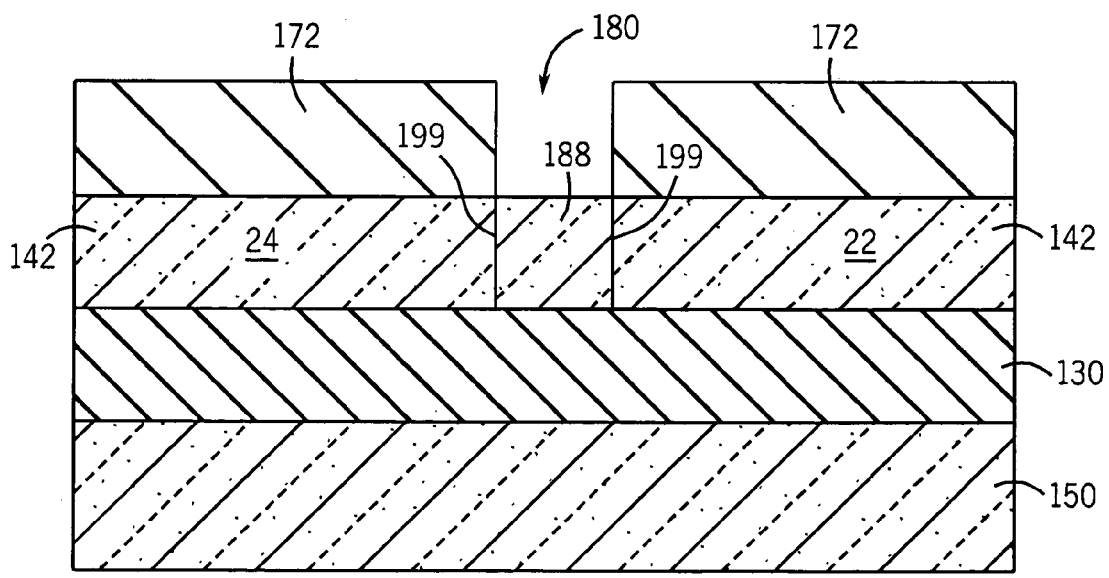
FIG. 10 is a schematic cross-sectional view of the portion of the integrated circuit illustrated in FIG. 8 showing the strained silicon formation.

With reference to FIGS. 9 and 10, a strained fin-based channel structure or region 188 (e.g., a strained-Si MOSFET channel region) is formed above layer 130 in step 45 of process 10 (FIG. 1). Preferably, channel region 188 fills only a portion of trench 180. In one preferred embodiment, region 188 is formed by selective silicon epitaxial growth using compound semiconductor layer 142 as a seed surface. Preferably, trench 180 is relatively narrow so that the region 188 can be epitaxially grown.

Region 188 is a strained layer since its lattice is aligned with that of the compound semiconductor layer 142 that has a larger lattice constant. Surfaces 199 of trench 180 (FIG. 10) serve as a seed for crystalline growth of structure or region 188. The silicon germanium lattice associated with layer 142 results in a more widely spaced interstitial silicon lattice in region 188, thereby creating a tensile strain in region 188. As a result, the epitaxial silicon associated with region 188 is subject to tensile strain.

The application of tensile strain to region 188 causes 4 of 6 silicon valance bands associated with the silicon lattice to increase in energy and 2 of its valance bands to decrease in energy. As a result of quantum effects, electrons effectively weigh approximately 30% less when passing through the lower energy bands of the strained silicon in region 188. As a result, carrier mobility is dramatically increased in region 188, offering the potential increase in mobility of 80% or more for electrons and 20% or more for holes. The increase in mobility has been found to persist for current fields of up to 1.5 megavolts/centimeters. These factors are believed to enable a device speed increase of 35% without further reduction of size, or 25% reduction in power consumption without a reduction in performance.

In one embodiment, trench 180 can be completely filled with the material for region 188 and thereafter patterned in a photolithographic process to leave region 188 within trench 180. According to such process, portions on the left and right side (in FIG. 9) of the material filling trench 180 are removed to leave region 188. Regions 200 and 202 of material may be left behind following such removal process used to form region 188. An etching process selective to strained silicon with respect to layer 172 can be utilized to form region 188 in accordance with such an embodiment.

With reference to FIGS. 11 and 12, a gate dielectric layer 192 is formed in accordance with step 175 of process 10 (FIG. 1). Layer 192 can be thermally grown or deposited to a thickness of between approximately 0.5 nanometers and 1.5 nanometers on the three exposed sides of channel structure 188. Gate conductor 190 is provided to complete the gate structure. Gate conductor 190 can be approximately 50–150 nanometers thick polysilicon layer deposited by CVD. Conventional IC processes can be utilized to provide contacts, interconnect layers, etc.

Figure 13:
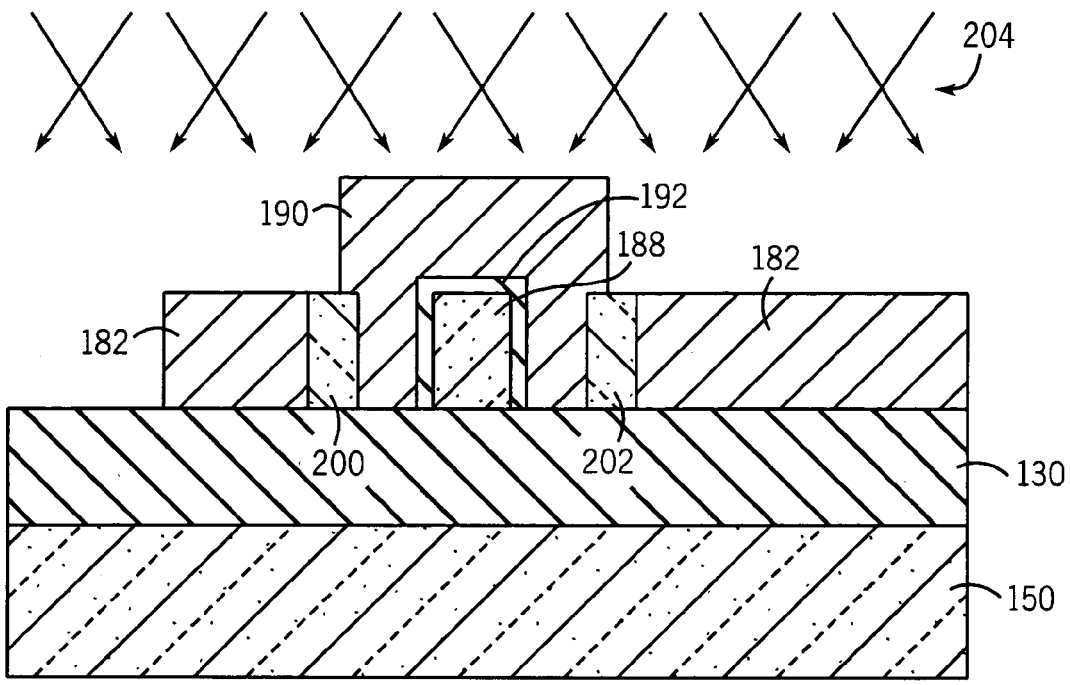
FIG. 13 is a schematic cross-sectional view of the portion of the integrated circuit illustrated in FIG. 11 showing a doping step.
Figure 14:
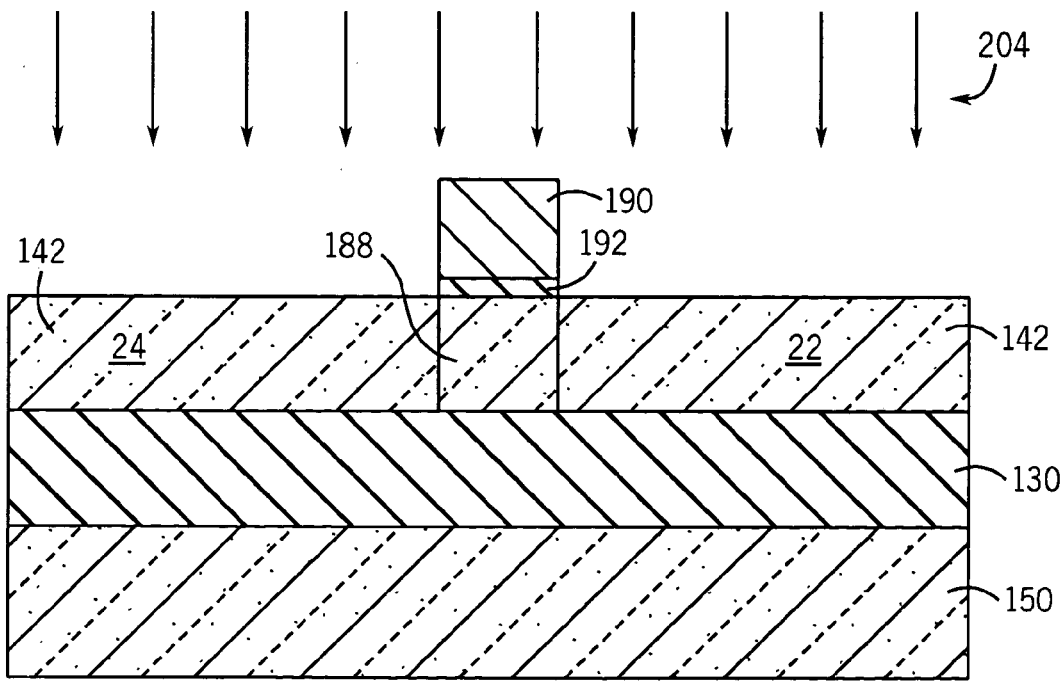
FIG. 14 is a schematic cross-sectional view of the portion of the integrated circuit illustrated in FIG. 12 showing a doping step.

As shown in FIGS. 13 and 14, layer 172 is removed, after which a dopant implant for the source region 22, drain region 24, and gate conductor 190 is provided (represented by arrows 204 in FIGS. 13 and 14).

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. Various changes may be made to the details disclosed without departing from the scope of the invention which is defined by the following claims.

What is claimed is:

1. A method of forming a fin-shaped transistor, the method comprising:
   providing a sacrificial fin structure source region and drain region in a compound semiconductor layer;
   removing the sacrificial fin structure to form a trench in the compound semiconductor layer;
   providing a fin-shaped strained silicon structure within the trench to form a fin-shaped channel region, the trench being associated with the fin-shaped transistor; and
   forming a gate structure for the fin-shaped strained silicon structure.

2. The method of claim 1, further comprising providing a sacrificial gate structure adjacent the sacrificial fin structure.

3. The method of claim 2, wherein the sacrificial gate structure includes nitride.

4. The method of claim 2, further comprising removing the sacrificial gate structure.

5. The method of claim 4, wherein the sacrificial gate structure includes polysilicon.

6. The method of claim 1, wherein the compound semiconductor layer includes a source region and a drain region, the sacrificial fin structure being between the source region and the drain region.

7. The method of claim 6, wherein the compound semiconductor layer is a silicon germanium layer.

8. The method of claim 6, wherein the sacrificial fin structure includes silicon germanium.

9. The method of claim 1, wherein the fin-shaped channel region has an aspect ratio of between approximately 1.5 and 3.0.

10. A method of forming a finFET, the method comprising:
    providing a first layer above an insulating layer above a substrate, the first layer including silicon germanium, the first layer including a fin structure source region and drain region;
    removing the fin structure between the source and drain regions to form an aperture in the first layer;
    providing a strained material within the aperture; and
    providing a gate structure for the strained material to form the finFET.

11. The method of claim 10, wherein the removing step is an etching step selective to the fin structure.

12. The method of claim 10, wherein the strained material is provided by selective silicon epitaxy.

13. The method of claim 10, further comprising forming a gate dielectric structure along sidewalls and a top of the strained material.

14. The method of claim 10, wherein the strained material is grown within the aperture in the first layer.

15. The method of claim 14, wherein the strained material includes silicon.

16. The method of claim 15, wherein the fin structure is between a source region and a drain region.

17. A method of fabricating an integrated circuit including a fin-based transistor, the method comprising steps of:
    providing an insulative material;
    providing a strain-inducing layer above the insulative material, the strain-inducing layer including a source region, a drain region and a narrow trench, the narrow trench including a sacrificial fin structure located between the source region and the drain region;
    removing the sacrificial fin structure; and
    forming a strained material in the narrow trench.

18. The method of claim 17, wherein the removing step is an etching step selective to the fin structure.

19. The method of claim 17, further comprising providing a gate structure for the strained material.

20. The method of claim 19, wherein the gate structure includes polysilicon.

* * * * *

UNITED STATES PATENT AND TRADEMARK OFFICE
CERTIFICATE OF CORRECTION

PATENT NO. : 6,936,516 B1
DATED : August 30, 2005
INVENTOR(S) : Goo et al.

It is certified that error appears in the above-identified patent and that said Letters Patent is hereby corrected as shown below:

Column 7,
Line 47, insert -- , -- after "structure".

Column 8,
Line 20, insert -- , -- after "structure".
Lines 22 and 23, move "between the source and drain regions" after "first layer".

Signed and Sealed this

Twenty-fifth Day of April, 2006

JON W. DUDAS
*Director of the United States Patent and Trademark Office*